(12) United States Patent
Moon et al.

(10) Patent No.: US 9,245,600 B2
(45) Date of Patent: Jan. 26, 2016

(54) SEMICONDUCTOR DEVICE AND OPERATING METHOD THEREOF

(71) Applicant: SK hynix Inc., Icheon-si Gyeonggi-do (KR)

(72) Inventors: Young-Suk Moon, Icheon-si (KR); Yong-Kee Kwon, Seoul (KR); Hong-Sik Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 161 days.

(21) Appl. No.: 13/913,058

(22) Filed: Jun. 7, 2013

(65) Prior Publication Data

US 2014/0095824 A1 Apr. 3, 2014

(30) Foreign Application Priority Data

Sep. 28, 2012 (KR) .................. 10-2012-0109340

(51) Int. Cl.
*G11C 7/10* (2006.01)
*G11C 7/22* (2006.01)

(52) U.S. Cl.
CPC ............ *G11C 7/1039* (2013.01); *G11C 7/22* (2013.01)

(58) Field of Classification Search
None
See application file for complete search history.

(56) References Cited

U.S. PATENT DOCUMENTS

| 5,822,772 | A | 10/1998 | Chan et al. | |
|---|---|---|---|---|
| 6,591,349 | B1 | 7/2003 | Steinman et al. | |
| 7,051,172 | B2 | 5/2006 | Mastronarde et al. | |
| 2005/0091460 | A1* | 4/2005 | Rotithor et al. | 711/158 |
| 2006/0026342 | A1* | 2/2006 | Calvignac et al. | 711/105 |

FOREIGN PATENT DOCUMENTS

KR 1020027013238 A 10/2002

* cited by examiner

*Primary Examiner* — Gary Portka
(74) *Attorney, Agent, or Firm* — William Park & Associates Ltd.

(57) ABSTRACT

A semiconductor device comprises: a read queue configured to store one or more read requests to a semiconductor memory device; a write queue configured to store one or more write requests to the semiconductor memory device; and a dispatch block configured to determine a scheduling order of the one or more read requests and the one or more write requests and switch to the read queue or to the write queue if a request exists in a Row Hit state in the read queue or in the write queue.

15 Claims, 14 Drawing Sheets

| Bank Address | Row Address | State |
|---|---|---|
| Bank Address | Row Address | State |
| Bank Address | Row Address | State |

· ·

| Bank Address | Row Address | State |
|---|---|---|
| Bank Address | Row Address | State |
| Bank Address | Row Address | State |

FIG. 4

| tRP | tRCD | tRAS | tRC |
|---|---|---|---|
| tRP | tRCD | rRAS | tRC |

| tRP | tRCD | tRAS | tRC |
|---|---|---|---|
| tRP | tRCD | rRAS | tRC |

SEMICONDUCTOR DEVICE AND OPERATING METHOD THEREOF

CROSS-REFERENCE TO RELATED APPLICATIONS

The present application claims priority of Korean Patent Application No. 10-2012-0109340, filed on Sep. 28, 2012, which is incorporated herein by reference in its entirety.

BACKGROUND

1. Technical Field

Embodiments of the present invention generally relate to a semiconductor device and an operating method thereof, and more particularly, to a semiconductor device capable of scheduling read and write operations of a semiconductor memory device, and an operating method thereof.

2. Related Art

A semiconductor memory device like a Dynamic Random-Access Memory (DRAM) is normally controlled by a memory controller. The memory controller includes an arbitration block to schedule read requests and write requests from host.

Conventional memory controllers generally process read requests before write requests and the write requests have priority only when the number of write requests waiting in the queue is larger than a predetermined threshold value.

But the conventional memory controllers do not consider addresses of the read and write requests, which results in limiting the efficiency of the semiconductor memory device.

SUMMARY

Various embodiments are directed to a semiconductor device including a read queue storing read requests and a write queue storing write requests and capable of scheduling the requests stored therein and an operating method thereof.

In an embodiment, a method of a semiconductor device may include: if one or more read requests in a Row Hit state exist in a read queue, processing the one or more read requests; if no read request in the Row Hit state exists in the read queue, switching to a write queue; if one or more write requests in the Row Hit state exist in the write queue, processing the one or more write requests; and if no write request in the Row Hit state exists in the write queue, switching to the read queue.

The method of a semiconductor device may further include processing one or more write requests in the write queue if a length of the write queue exceeds a first threshold value.

The method of a semiconductor device may further include processing one or more read requests in the read queue if a length of the write queue is zero.

The method of a semiconductor may further include processing one or more write requests in the write queue if a length of the read queue is zero.

The method of a semiconductor device may further include processing one or more read requests in the read queue if a length of the write queue is less than a second threshold value.

In an embodiment, a semiconductor device may include a read queue configured to store one or more read requests to a semiconductor memory device; a write queue configured to store one or more write requests to the semiconductor memory device and a dispatch block configured to determine a scheduling order of the requests and switch to the read queue or to the write queue if a request exists in a Row Hit state in the read queue or in the write queue.

In the semiconductor, the dispatch block may process the one or more read requests if one or more read request in the Row Hit state exist in the read queue, switch to the write queue if no read request in the Row Hit state exists in the read queue, process the one or more write requests if one or more write request in the Row Hit state exist in the write queue, and switch to the read queue if no write request in the Row Hit state exists in the write queue.

In an embodiment, a system may include a semiconductor memory device and a controller controlling the semiconductor memory device wherein the controller may include a read queue configured to store one or more read requests to the semiconductor memory device; a write queue configured to store one or more write requests to the semiconductor memory device; and a dispatch block configured to determine a scheduling order of the one or more read requests and the one or more write requests and switch to the read queue or to the write queue if there is a request in a Row Hit state in the read queue or in the write queue.

In the system, the dispatch block of the controller may process the one or more read requests if one or more read request in the Row Hit state exist in the read queue, switch to the write queue if no read request in the Row Hit state exists in the read queue, process the one or more write requests if one or more write request in the Row Hit state exist in the write queue, and switch to the read queue if no write request in the Row Hit state exists in the write queue.

In an embodiment, a semiconductor device may include: a read queue configured to store at least one read request to a semiconductor memory device; a write queue configured to store at least one write request to the semiconductor device; and a dispatch block configured to select a request to process the at least one read request from the read queue or the at least one write request from the write queue if the request is in a Row Hit state in the read queue or the write queue.

In an embodiment, a memory system includes memory controller, and a semiconductor memory device comprising: a read queue configured to store one or more read requests to the semiconductor memory device; a write queue configured to store one or more write requests to the semiconductor memory device; and a dispatch block configured to determine a scheduling order of the one or more read requests and the one or more write requests and switch to the read queue or to the write queue if a request exists in a Row Hit state in the read queue or in the write queue.

In an embodiment, an electronic device includes a memory system communicatively coupled to a central processing unit; the memory system includes a semiconductor memory device, the semiconductor memory device comprises: a read queue configured to store one or more read requests to a semiconductor memory device; a write queue configured to store one or more write requests to the semiconductor memory device; and a dispatch block configured to determine a scheduling order of the one or more read requests and the one or more write requests and switch to the read queue or to the write queue if a request exists in a Row Hit state in the read queue or in the write queue.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
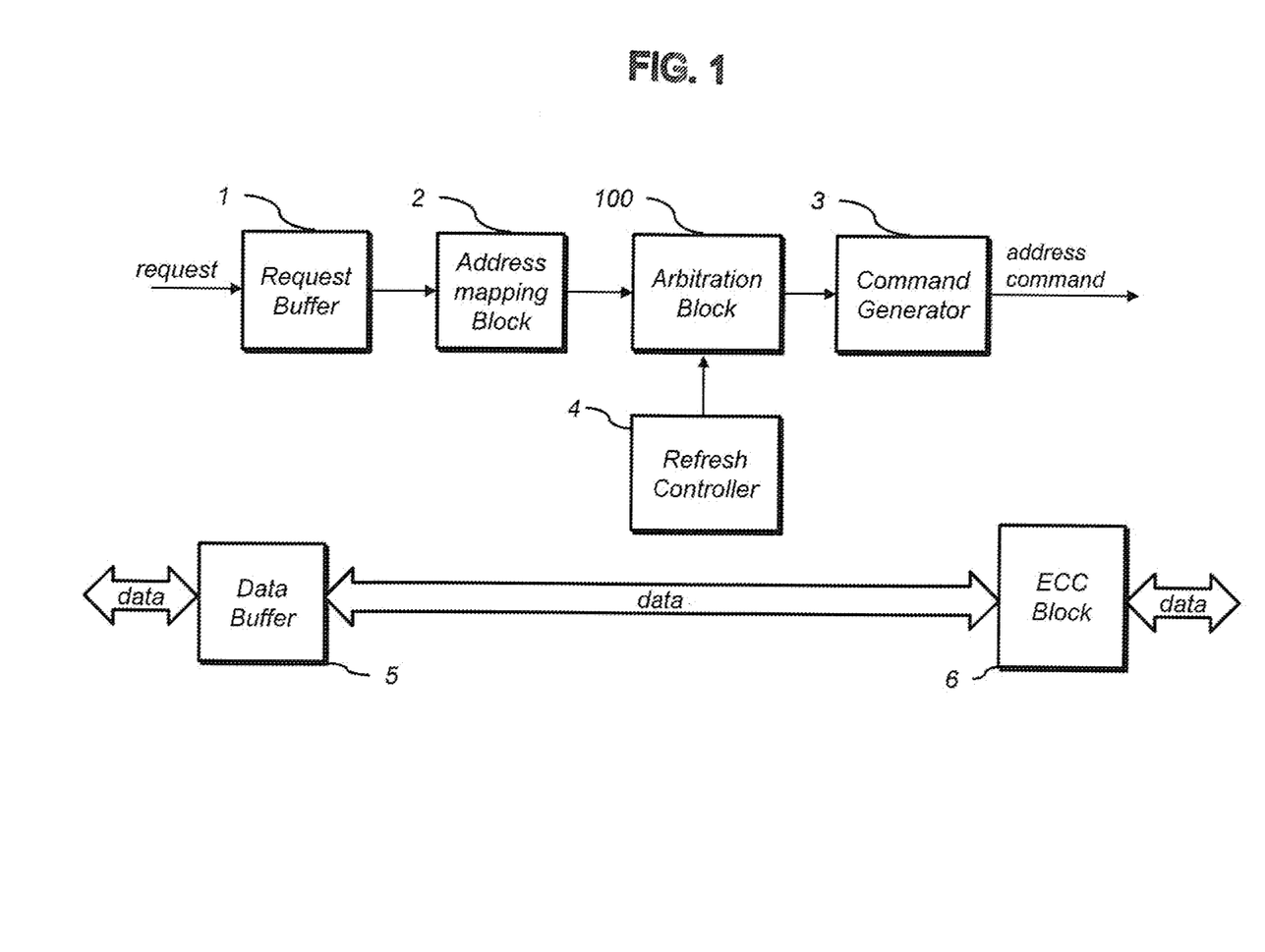
FIG. 1 is a block diagram illustrating a memory controller in accordance with an embodiment of the present invention.

FIG. 1 is a block diagram illustrating a memory controller in accordance with an embodiment of the present invention.

The memory controller may be included in a processor or may exist out of a processor. Throughout the description hereafter the memory controller may represent the memory controller itself or a semiconductor memory device such as a processor including the memory controller.

The memory controller according to an embodiment of the present invention may include a request buffer 1 receiving requests from host; an address mapping block 2 mapping a logical address from host to a physical address of a semiconductor memory device; a command generator 3 generating a command corresponding to a request from host; a refresh controller 4 controlling a refresh operation of a semiconductor memory device; a data buffer 5 receiving or sending data with host; a ECC (Error Correcting Code) block 6 for detecting and correcting errors in the data; and an arbitration block 100 scheduling processing order of requests.

For the aforementioned components of the memory controller excluding the arbitration block 100 are well known in the art, the detailed description thereof will be omitted. The detailed description of the arbitration block 100 according to an embodiment of the present invention will be explained in the following.

Figure 2:
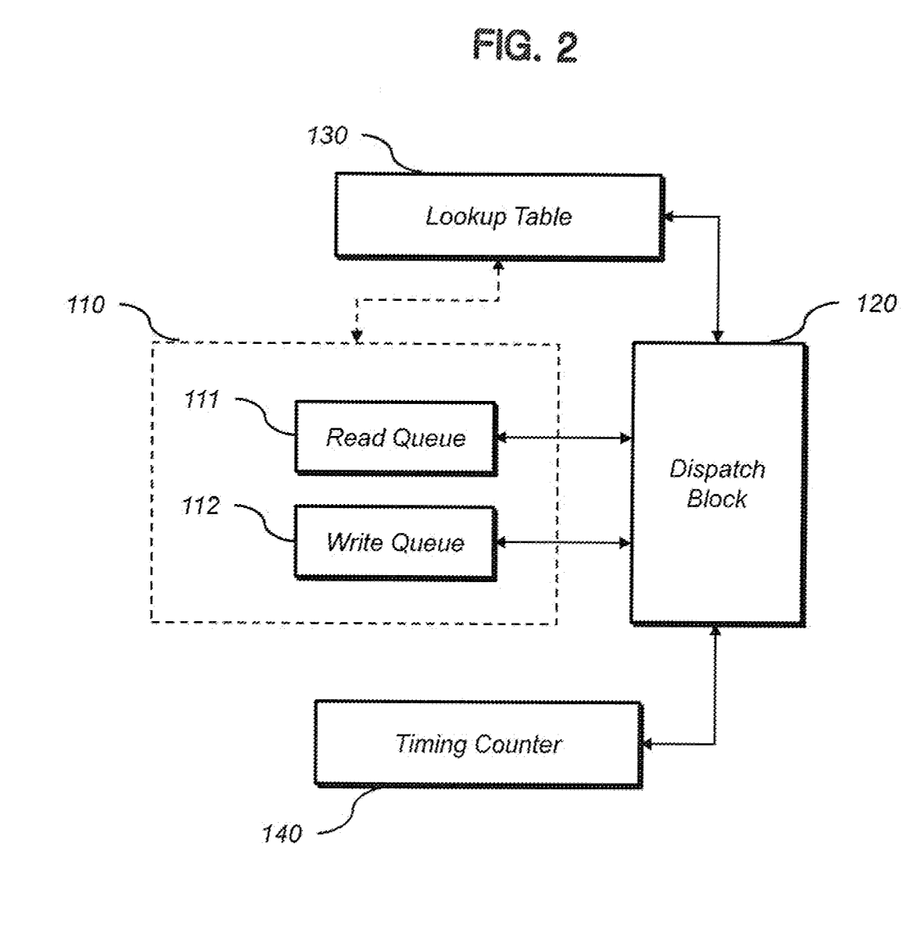
FIG. 2 is block diagram illustrating an arbitration block in accordance with an embodiment of the present invention.

FIG. 2 is a block diagram of an arbitration block 100 according to an embodiment of the present invention.

The arbitration block 100 may include a request storage 110 storing read requests and write requests. The request queue 110 may include a read request storage 111 storing read requests and may include a write request storage 112 storing write requests.

The read request storage 111 and the write request storage 112 generally use 'QUEUE' data structure but other kinds of data structures may be used. Throughout the description, "request queue 110," "read queue 111," and "write queue 112" may be used instead of request storage 110, read request storage 111, and write request storage 112.

The read queue 111 may store one or more read requests and the write queue 112 may store one or more write requests. Each of the read requests and/or the write requests may include an address at which the read request or write request should be performed.

The arbitration block 100 according to an embodiment of the present invention may determine whether each read request or write request is in a 'Row Hit' state according to addresses corresponding to read requests stored in the read queue 111 and write requests stored in the write queue 112.

The dispatch block 120 may select a request to process from the read queue 111 or from the write queue 112 according to whether the state of the request is in the 'Row Hit' state. The specific operations of the dispatch block 120 may be described with reference to FIG. 5.

The 'Row Hit' state may be determined by comparing the row address activated in the semiconductor memory device with the address corresponding to the request. If the semiconductor memory device includes a plurality of banks, the 'Row Hit' state may be determined for each bank.

The arbitration block 100 according to an embodiment of the present invention may further include lookup table 130 to determine the 'Row Hit' state. In this case 'Row Hit' state of each request stored in the request queue 110 may be determined by comparing addresses stored in the lookup table 130 with the address of the request.

Determining the 'Row Hit' state may be performed by the dispatch block 120. The arbitration block 100 according to an embodiment of the present invention may further include a state register (not shown) to store the 'Row Hit' state for each request in the request queue 110.

The state register may be included in the request queue 110. In this case a comparing block (not shown) to determine 'Row Hit' or 'Row Miss' may be included in the request queue 110 or out of the request queue 110. The comparing block may directly refer to the lookup table 130.

Figure 3:
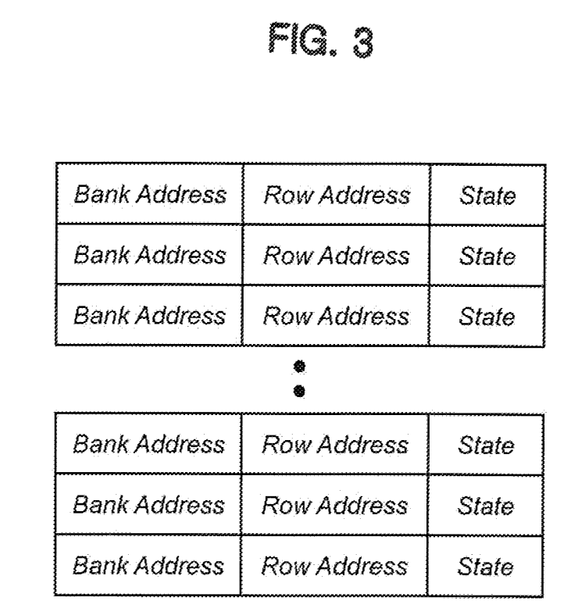
FIG. 3 is block diagram illustrating a data structure of a lookup table in accordance with an embodiment of the present invention.

FIG. 3 illustrates a data structure of the lookup table 130 according to an embodiment of the present invention.

FIG. 3 corresponds to the memory device that may include a plurality of banks, a bank address field, a row address field, and a state field.

The bank address field may store a bank address, the row address field may store a row address, and the state field may store a current state of the corresponding bank and row address. The state may be an IDLE state or an ACTIVE state.

The requested address may be compared with the bank address, the row address and the state stored in the lookup field 130 to determine the 'Row Hit' or the 'Row Miss' of each request.

Returning to FIG. 2, the arbitration block 100 according to an embodiment of the present invention may further include a timing counter 140 to determine whether a timing condition is met. In the synchronous semiconductor memory device, a timing value may be represented as a number of clocks.

The timing counter 140 according to an embodiment of the present invention may include a plurality of sub counters each having an initial value corresponding to the kind of the request. For example, the dispatch block 120 may control a sub counter corresponding to a timing condition required to be checked before processing a request. When the sub counter counts down to 0, the timing counter 140 may notify the dispatch block 120 and the dispatch block 120 may schedule the corresponding request to be processed at the command generator (3 of FIG. 1).

Figure 4:
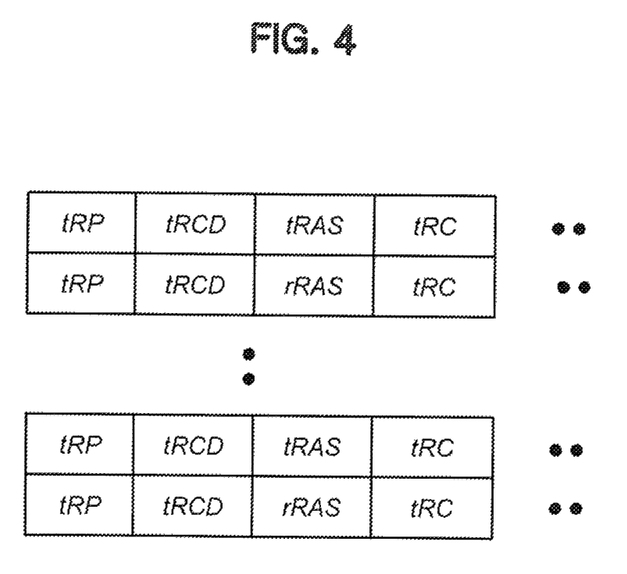
FIG. 4 is a block diagram illustrating a data structure of a timing counter in accordance with an embodiment of the present invention.

FIG. 4 illustrates the timing counter 140 according to an embodiment of the present invention.

As aforementioned, the timing counter 140 may include one or more sub counters corresponding to one or more timing conditions such as tRP, tRCD, tRAS, tRC and etc.

Figure 5:
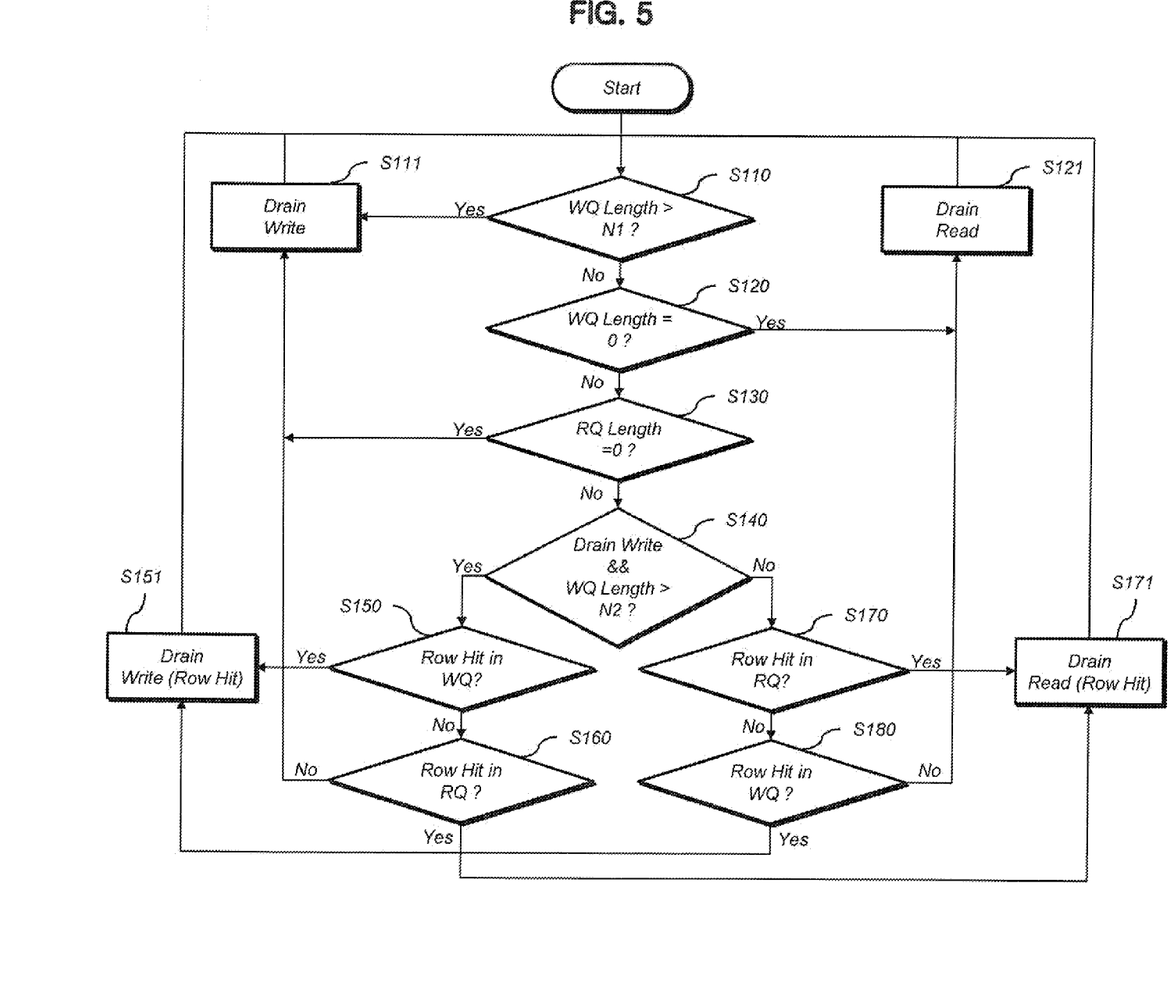
FIG. 5 is a flowchart illustrating an operation method of the arbitration block in accordance with an embodiment of the present invention.

FIG. 5 illustrates an operating method of the arbitration block 100 according to an embodiment of the present invention.

At step S110, it may be determined whether the length of the write queue 112, that is the number of requests stored in the write queue 112, exceeds a first threshold value N1.

If the length of write queue 112 exceeds the first threshold value N1, it is considered that there are too many write requests in the write queue 112 and the write requests are processed at S111. The requests in the write queue 112 may be scheduled considering a request time, 'Row Hit' state, or other known criteria. For example, after the write requests in 'Row Hit' state are processed, write requests that came earlier may be processed.

If the length of write queue 112 does not exceed the first threshold value N1, it may be determined whether the write queue 112 is vacant at S120.

When the write queue 112 is vacant, read requests in read queue 111 may be processed at S121. The requests in the read queue 111 may be scheduled considering the request time, 'Row Hit' state, or other known criteria. For example after the read requests in 'Row Hit' are processed, read requests that came earlier may be processed.

If the write queue 112 is not vacant, it may be determined whether the read queue 111 is vacant at S130.

If the read queue 111 is vacant, write requests in write queue 112 may be processed at S111.

If the read queue 111 is not vacant, the process may move to step S140.

Before proceeding to step S140, the read queue 111 may store one or more read requests and the write queue 112 may store one or more write requests less than the first threshold value N1.

At step S140, it may be determined whether a write request was processed previously and whether the length of the write queue 112 exceeds the second threshold value N2. The second threshold value N2 is an integer less than the first threshold value N1 and an integer as same as or larger than 0.

If it is determined that a write request was previously processed and the length of the write queue 112 is larger than the second threshold value N2 at step S140, it may be determined whether a write request in the 'Row Hit' state exists in the write queue 112 at step S150.

If it is determined that a write request in the 'Row Hit' state exists in the write queue 112 at step S150, the write request in the 'Row Hit' state may be processed at step S151.

If it is determined that a write request in the 'Row Hit' state does not exist in the write queue 112 at step S150, it may be determined whether a read request in the 'Row Hit' state exists in the read queue 111 at step S160.

If it is determined that a read request in 'Row Hit' state exists in the read queue 111 at step S160, the read request in 'Row Hit' state may be processed at step S171.

If it is determined that a read request in 'Row Hit' state does not exist in the write queue 111 at step S160, the write requests may be processed at step S111.

If it is determined that a write request was not previously processed or the length of the write is not larger than the second threshold value N2 at step S140, it may be determined whether a read request in 'Row Hit' state exists in the read queue 111 at step S170.

If it is determined that a read request in 'Row Hit' state exists in the read queue 111 at step S170, the read request in 'Row Hit' state may be processed at step S171.

If it is determined that a read request in 'Row Hit' state does not exist in the read queue 111 at step S170, it may be determined whether a write request in the 'Row Hit' state exists in the write queue 112 at step S180.

If it is determined that a write request in the 'Row Hit' state exists in the write queue 112 at step S180, the write request in the 'Row Hit' state may be processed at step S151.

If it is determined that a write request in the 'Row Hit' state does not exist in the write queue 111 at step S180, the read requests may be processed at step S121.

The aforementioned steps may be implemented with series of software codes stored in the nonvolatile memory device such as ROM or flash memory device. And the dispatch block 120 may execute those codes to perform operations illustrated in FIG. 5.

FIGS. 6a through 6d are diagrams illustrating an operation of the arbitration block 100 in accordance with an embodiment of the present invention.

Figure 6A:
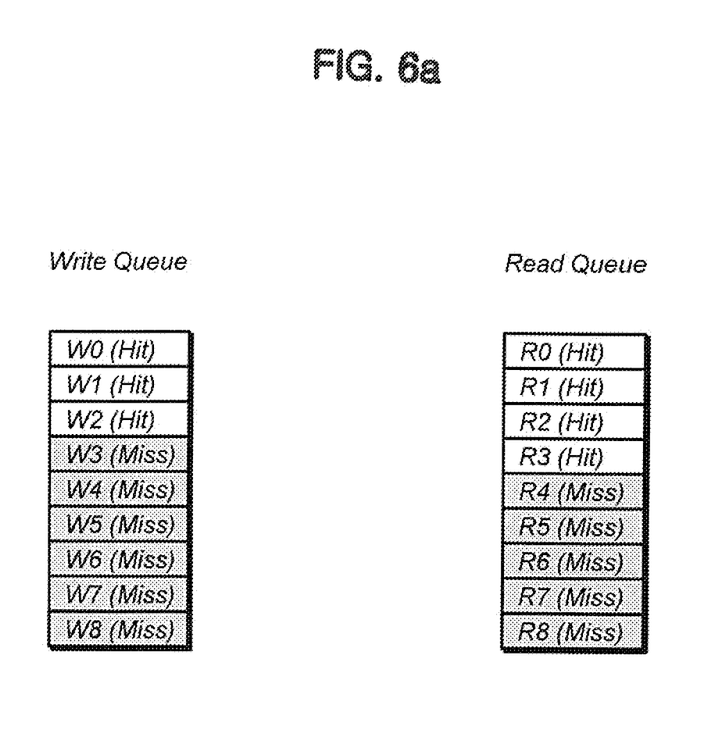
FIGS. 6a through 6d are diagrams illustrating an operation of the arbitration block in accordance with an embodiment of the present invention.
Figure 6B:
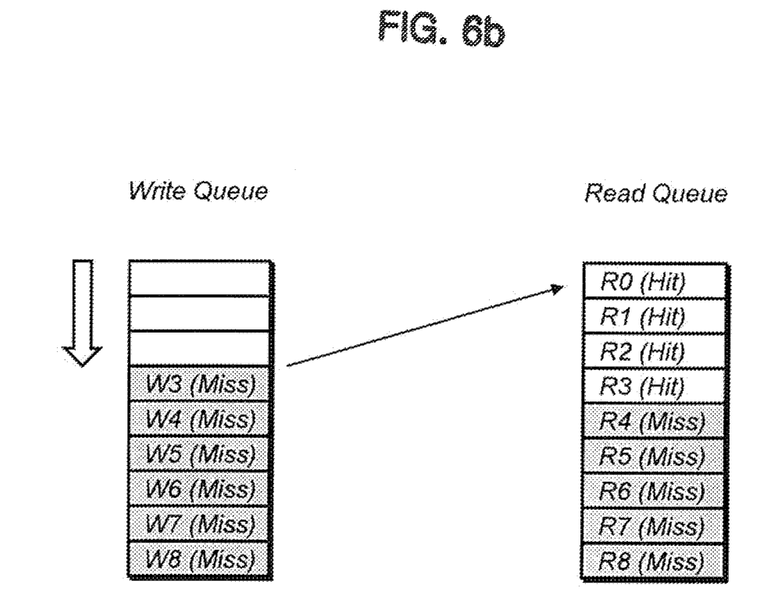

It is assumed that FIG. 6a depicts a request queue 110 right before the step S150 is performed. In FIG. 6a, write requests W0, W1, W2 in write queue 112 are in the 'Row Hit' state and the other write requests are in the 'Row Miss' state. Therefore write requests W0, W1, W2 are processed as illustrated in FIG. 6b. This corresponds to the step S151 of FIG. 5. Since there are no write requests in the 'Row Hit' state left in the write queue 112, the process may move to step S160 of FIG. 5.

Figure 6C:
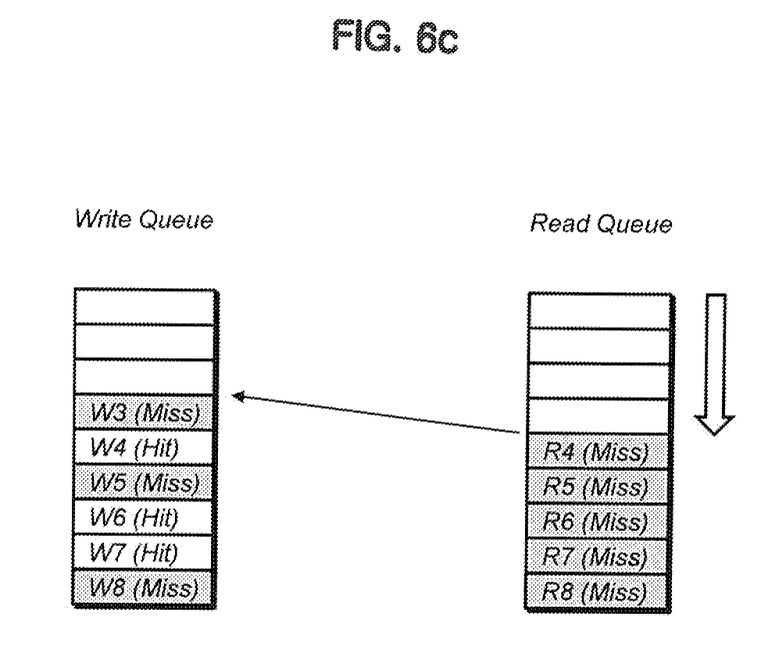

In FIG. 6b, Read requests R0, R1, R2, and R3 in read queue 111 are in the 'Row Hit' state and the other read requests are in the 'Row Miss' state. Therefore read requests R0, R1, R2, and R3 are processed as illustrated in FIG. 6c. This corresponds to the step S171 of FIG. 5. Since there are no read requests in the 'Row Hit' state left in the read queue 111, the process may move to step S180 of FIG. 5.

The 'Row Hit' or 'Row Miss' state of the request in read queue 111 and write queue 112 may be updated by referencing the lookup table 130.

Figure 6D:
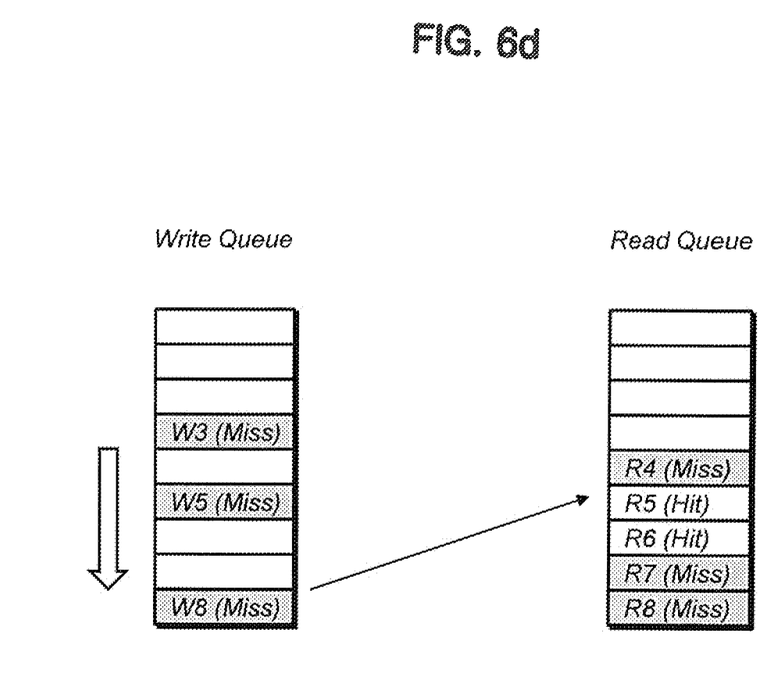

In FIG. 6c, write requests W4, W6, W7 in write queue 112 are in the 'Row Hit' state and the other write requests are in the 'Row Miss' state. Therefore write requests W4, W6, W7 are processed as illustrated in FIG. 6d. This corresponds to the step S151 of FIG. 5. Since there are no write requests in the 'Row Hit' state left in the write queue 112, the process may move to step S160 of FIG. 5.

As described above, the dispatch block 120 may alternate between the read queue 111 and the write queue 112 to process requests in 'Row Hit' state.

Figure 7A:
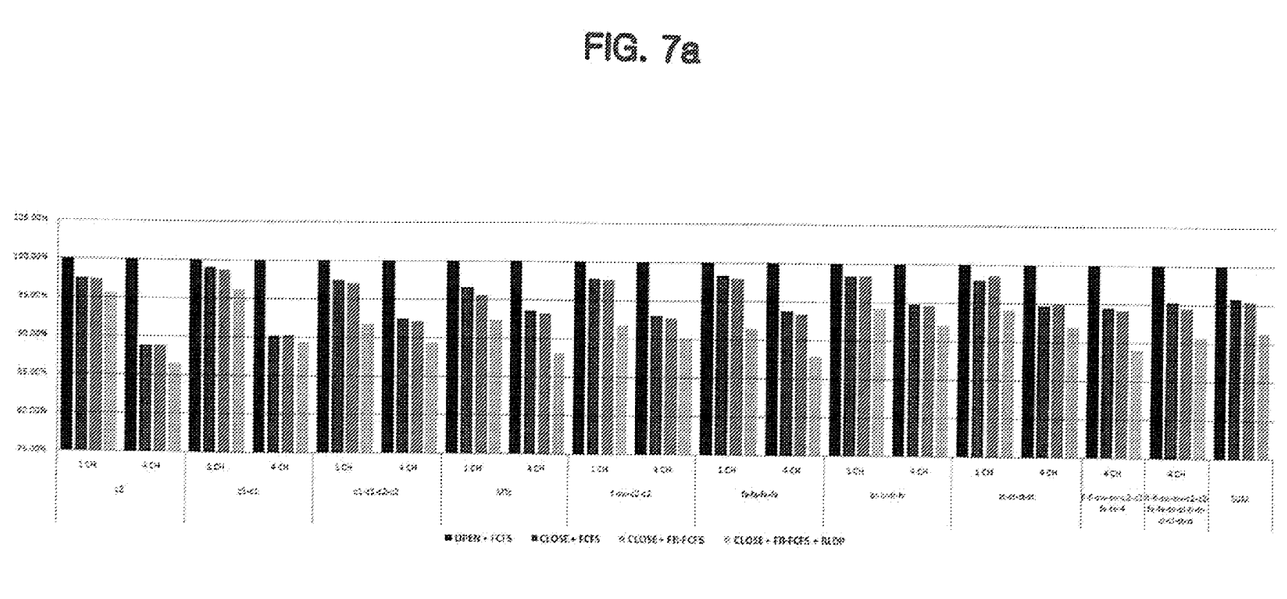
FIGS. 7a through 7c are graphs illustrating performance of the memory controller in accordance with an embodiment of the present invention.
Figure 7B:
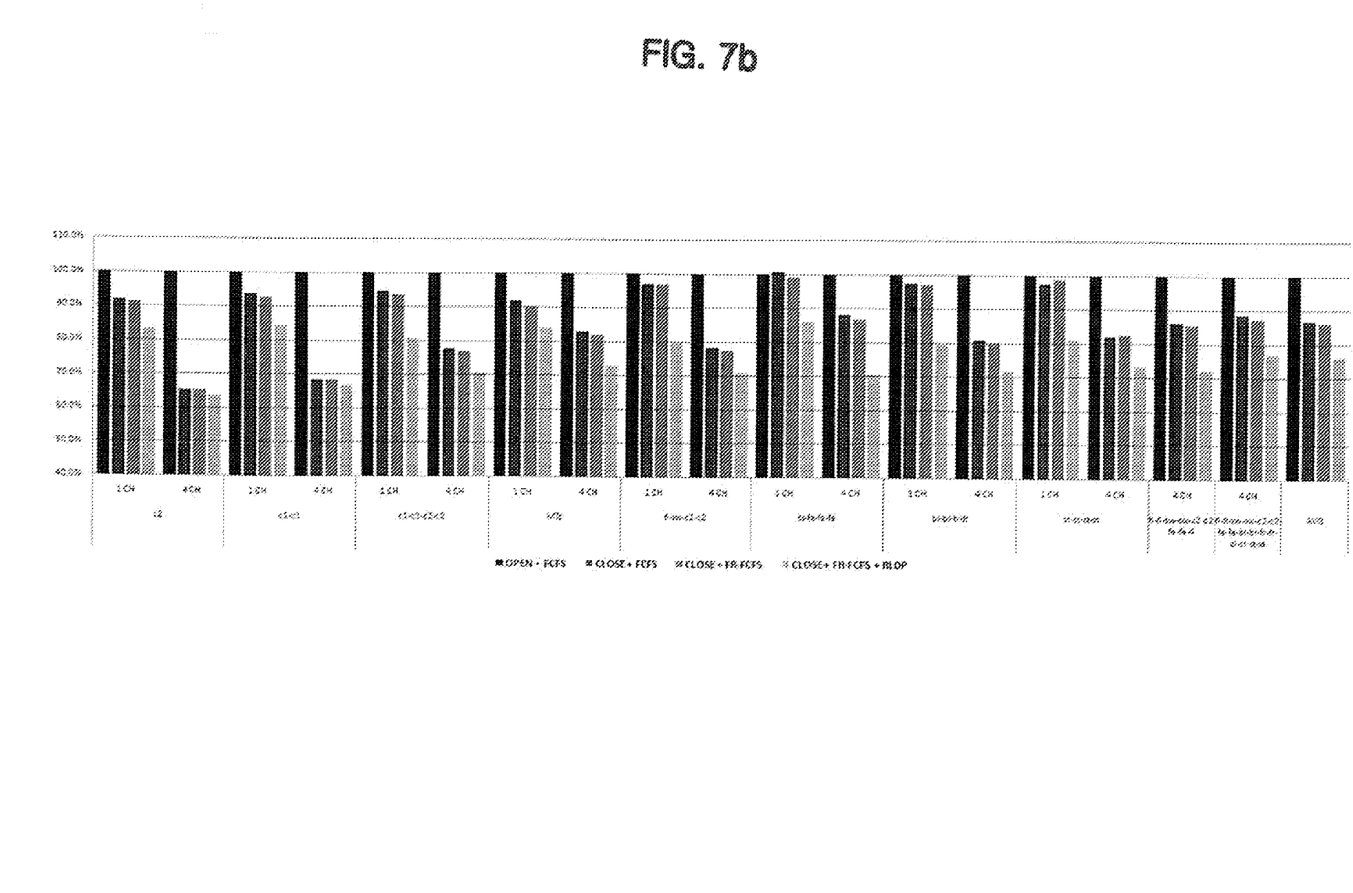
Figure 7C:
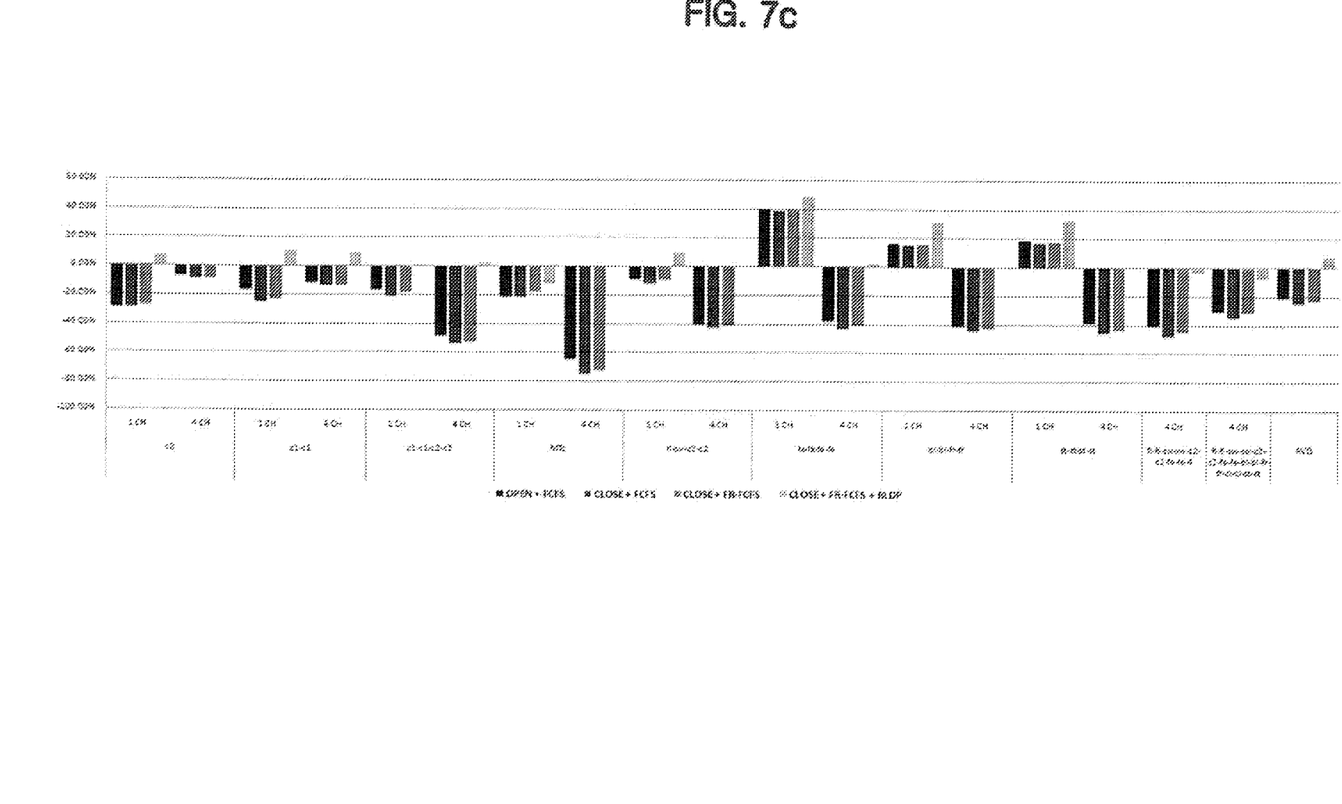

FIGS. 7a through 7c are graphs illustrating performance of the memory controller in accordance with an embodiment of the present invention.

The graphs represent a result of a simulation performed with USIMM simulator (http://utaharh.blogspot.kr/2012/02/usimm.html) and PARSEC benchmark.

In the graph OPEN may represent a policy to keep open rows in a bank open when the memory controller is in an IDLE state and CLOSE represents a policy to close open rows in a bank when the memory controller is in the IDLE state.

In the graph FCFS may represent a scheduling method that processes a request by a 'first-come first-processed' policy; FRFS may represent a scheduling method that processes a request in the 'Row Hit' state first; and FR-FCFS may represent a scheduling method that may process a request in the 'Row Hit' state first and then process a request by the 'first-come first-processed' policy.

The method according to an embodiment of the present invention is represented as RLDP and compared with prior arts like the following.

FIG. 7a illustrates the whole operation time when each method is applied. The values are represented by a percentage considering the whole operation time when OPEN and FCFS is applied is 100%. In the graph, the result is shown according to kinds of loads and kinds of methods.

Among prior art methods, the method using CLOSE and FR-FCFS performed the best. But the method according to an embodiment of the present invention RLDP which is applied with CLOSE and FR-FCFS performed better. It can be known from the graph that the enhancement is around 4%.

FIG. 7b illustrates the read queue latency when each method is applied. The unit is percent considering the read queue latency when OPEN and FCFS is applied is 100%. In the graph, the smaller number represents better performance.

Among prior art methods, the method using CLOSE and FR-FCFS performed best. But the method according to an embodiment of the present invention RLDP which is applied with CLOSE and FR-FCFS performed better. It can be known from the graph that the enhancement in performance is around 11%.

FIG. 7c illustrates a row hit rate in the write queue. It can be known from the graph that the enhancement in the row hit rate is around 30%. As the row hit rate increases, the cost caused by the row address crash during processing the write requests decreases, which results in performance enhancement.

Figure 8:
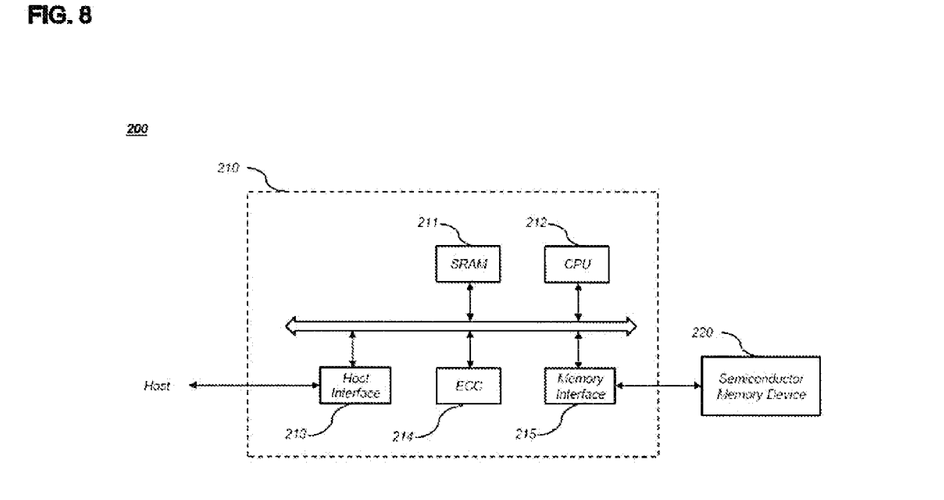
FIG. 8 is a block diagram illustrating a memory system in accordance with an embodiment of the present invention.

FIG. 8 is a block diagram illustrating a memory system according to an embodiment of the present invention.

In FIG. 8, the memory system 200 of the present invention may include a semiconductor memory device 220 and a memory controller 210.

The semiconductor memory device 220 may serve as a nonvolatile memory device such as MRAM, STT-MRAM, PCRAM, ReRAM, or FeRAM. The semiconductor memory device 220 may be a multi-chip package having flash memory chips.

The memory controller 210 may control the semiconductor memory device 220, and may include an SRAM 211, a host interface 213, an ECC 214, and a memory interface 215. The SRAM 211 may be used as an operation memory of the CPU 212, the CPU 212 may perform control operation for data exchange of the memory controller 210, and the host interface 213 may have data exchange protocol of a host accessed to the memory system 200. The ECC 214 may detect and correct error of data read from the semiconductor memory device 220, and the memory interface 215 may interface with the semiconductor memory device 220. The memory controller 210 may include further ROM for storing data for interfacing with the host, etc.

The memory system 200 may be used as a memory card or a solid state disk SSD by combination of the semiconductor memory device 220 and the memory controller 210. In the event that the memory system 200 is the SSD, the memory controller 210 may communicate with an external device, e.g. host through one of various interface protocols such as USB, MMC, PCI-E, SATA, PATA, SCSI, ESDI, IDE, etc.

Figure 9:
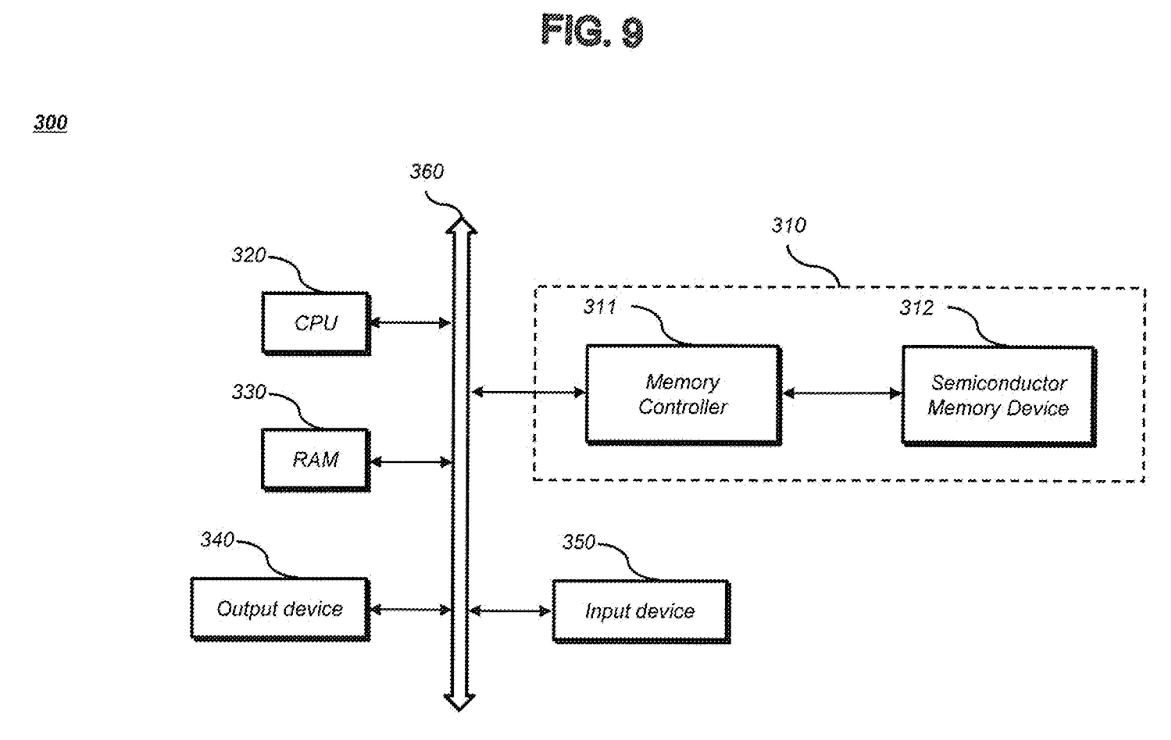
FIG. 9 is a block diagram illustrating an electronic device in accordance with an embodiment of the present invention.

FIG. 9 is a view illustrating an electronic device or a computing system according to an embodiment of the present invention.

In FIG. 9, the computing system 300 of the present invention may include a CPU 320 connected to a system bus 360, a RAM 330, an output device or user interface 340, an input device or modem 350, and a memory system 310 including a memory controller 311 and a semiconductor memory device 312. In case that the computing system 300 is a mobile device, a battery (not shown) for supplying an operation voltage to the computing system 300 may be further provided. The computing system 300 of the present invention may further including an application chipset, a CMOS image processor CIS, a mobile DRAM, etc.

The output device 340 (or user interface) may be a self-contained display in the case of a portable electronic device. The input device 350 (or modem) may be a physical keyboard or a virtual keyboard in the case of a portable electronic device, and may further include, without limitation, a trackball, touchpad, or other cursor control device combined with a selection control, such as a pushbutton, to select an item highlighted by cursor manipulation. The memory system 310 may include a semiconductor memory device as described in FIG. 8.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a read queue configured to store one or more read requests to a semiconductor memory device;
   a write queue configured to store one or more write requests to the semiconductor memory device;
   a dispatch block configured to determine a scheduling order of the one or more read requests and the one or more write requests and switch to the read queue or to the write queue according to whether a request in a Row Hit state exists in the read queue or in the write queue regardless of a request in a Row Miss state existing in the read queue or in the write queue; and
   a lookup table including an address field and a state field wherein the state field stores information on whether a corresponding address is in ACTIVE state or not,
   wherein the dispatch block determines the Row Hit or Row Miss state of each request by comparing an address of each request and information stored in the address field and the state field in the lookup table.

2. The semiconductor device of claim 1, further comprising:
   a register configured to store Row Hit or Row Miss state of each request in the read queue and write queue.

3. The semiconductor device of claim 1, wherein the address field includes a bank address field and a row address field.

4. The semiconductor device of claim 1, further comprising:
   a timing counter configured to notify whether one or more timing conditions corresponding to a request is met before processing the request.

5. The semiconductor device of claim 1, wherein the dispatch block processes the one or more read requests if one or more read request in the Row Hit state exist in the read queue, the dispatch block switches to the write queue if no read request in the Row Hit state exists in the read queue even if a read request in a Row Miss state exists, the dispatch block processes the one or more write requests if one or more write request in the Row Hit state exist in the write queue, and the dispatch block switches to the read queue if no write request in the Row Hit state exists in the write queue even if a write request in a Row Miss state exists.

6. The semiconductor device of claim 5, wherein the dispatch block further processes one or more write requests in the write queue if a length of the write queue exceeds a first threshold value.

7. The semiconductor device of claim 5, wherein the dispatch block further processes one or more read requests in the read queue if a length of the write queue is zero.

8. The semiconductor device of claim 5, wherein the dispatch block further processes one or more write requests in the write queue if a length of the read queue is zero.

9. The semiconductor device of claim 5, wherein the dispatch block further processes one or more read requests in the read queue if a length of the write queue is not larger than a second threshold value.

10. A system comprising:
a semiconductor memory device and
a controller controlling the semiconductor memory device, the controller comprising:
   a read queue configured to store one or more read requests to the semiconductor memory device;
   a write queue configured to store one or more write requests to the semiconductor memory device; and
a dispatch block configured to determine a scheduling order of the one or more read requests and the one or more write requests and switch to the read queue or to the write queue according to whether a request in a Row Hit state exists in the read queue or in the write queue regardless of a request in a Row Miss state existing in the read queue or in the write queue; and
a lookup table including an address field and a state field wherein the state field stores information on whether a corresponding address is in ACTIVE state or not,
wherein the dispatch block determines the Row Hit or Row Miss state of each request by comparing an address of each request and information stored in the address field and the state field in the lookup table.

11. The system of claim 10, wherein the dispatch block processes the one or more read requests if one or more read request in Row Hit state exist in the read queue, the dispatch block switches to the write queue if no read request in Row Hit state exists in the read queue even if a read request in a Row Miss state exists, the dispatch block processes the one or more write requests if one or more write request in Row Hit state exist in the write queue, and the dispatch block switches to the read queue if no write request in Row Hit state exists in the write queue even if a write request in a Row Miss state exists.

12. The system of claim 11, wherein the dispatch block further processes one or more write requests in the write queue if a length of the write queue exceeds a first threshold value.

13. The system of claim 11, wherein the dispatch block further processes one or more read requests in the read queue if a length of the write queue is zero.

14. The semiconductor device of claim 11, wherein the dispatch block further processes one or more write requests in the write queue if a length of the read queue is zero.

15. The semiconductor device of claim 11, wherein the dispatch block further processes one or more read requests in the read queue if a length of the write queue is not larger than a second threshold value.

\* \* \* \* \*